US010499532B1

(12) United States Patent
Keehn et al.

(10) Patent No.: US 10,499,532 B1
(45) Date of Patent: Dec. 3, 2019

(54) INFRASTRUCTURE FLOOR TILES FOR SERVER RACK PLACEMENT

(71) Applicant: Microsoft Technology Licensing, LLC, Redmond, WA (US)

(72) Inventors: Nicholas Andrew Keehn, Kirkland, WA (US); Winston Allen Saunders, Seattle, WA (US); Sean James, Olympia, WA (US); Saurabh Shrivastava, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/981,107

(22) Filed: May 16, 2018

(51) Int. Cl.
| H05K 7/14 | (2006.01) |
| H05K 7/20 | (2006.01) |
| E04F 15/06 | (2006.01) |
| E04F 15/024 | (2006.01) |
| E04B 5/48 | (2006.01) |
| H02G 3/38 | (2006.01) |

(52) U.S. Cl.
CPC .......... H05K 7/1497 (2013.01); E04B 5/48 (2013.01); E04F 15/02405 (2013.01); E04F 15/06 (2013.01); H02G 3/285 (2013.01); H05K 7/2079 (2013.01); H05K 7/20745 (2013.01)

(58) Field of Classification Search
CPC .................................................... H05K 7/1497
See application file for complete search history.

(56) References Cited

U.S. PATENT DOCUMENTS

| 5,992,108 | A | * | 11/1999 | Falcey ..................... E04B 5/48 52/126.6 |
| 2009/0301693 | A1 | | 12/2009 | Dawson et al. |
| 2015/0253821 | A1 | | 9/2015 | Palmer et al. |
| 2016/0366783 | A1 | * | 12/2016 | Dunn, Jr. ............. H05K 7/1497 |
| 2017/0086325 | A1 | * | 3/2017 | Connor ................ H05K 7/1489 |
| 2017/0268239 | A1 | * | 9/2017 | Kobayashi .......... H05K 7/1497 |

FOREIGN PATENT DOCUMENTS

| CN | 107743354 A | 2/2018 |
| WO | 2017022137 A1 | 2/2017 |

OTHER PUBLICATIONS

"International Search Report and Written Opinion Issued in PCT Application No. PCT/US2019/031400", dated Aug. 2, 2019, 15 Pages.

* cited by examiner

Primary Examiner — Mukundbhai G Patel
(74) Attorney, Agent, or Firm — Liang IP, PLLC

(57) ABSTRACT

An infrastructure floor tile for supporting and positioning a server rack in a datacenter includes a body including top, bottom and side surfaces and a first alignment surface on the top surface. The first alignment surface includes at least one of a projection and a recess. When a server rack is positioned on the first alignment surface of the infrastructure floor tile, the server rack is aligned by the first alignment surface relative to the body. N horizontal channels extend from one of the side surfaces to an opposite one of the side surfaces, where N is an integer greater than one. N vertical channels extending from the top surface of the body to the N horizontal channels, respectively. Power, cooling fluid and/ or data lines are connected to the server rack through at least one of the N horizontal channels and at least one of the N vertical channels.

20 Claims, 7 Drawing Sheets

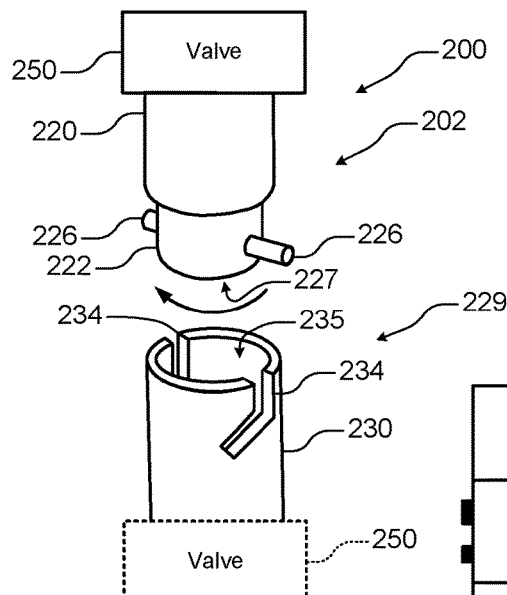
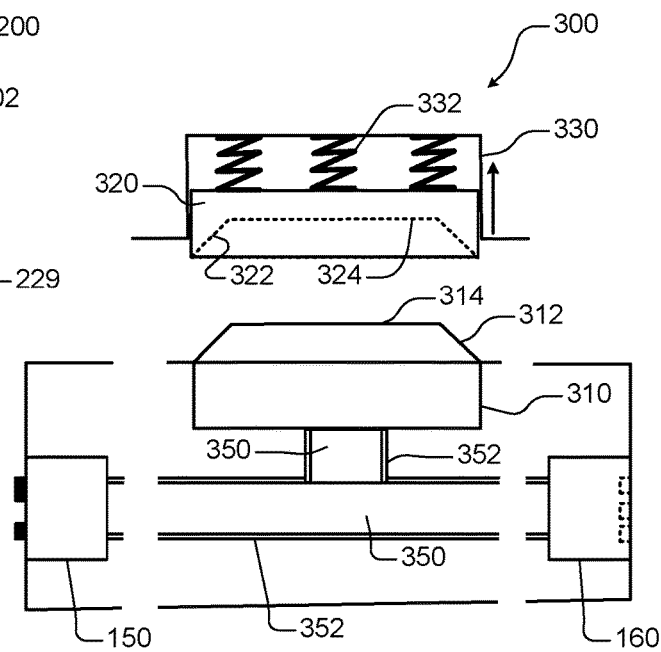
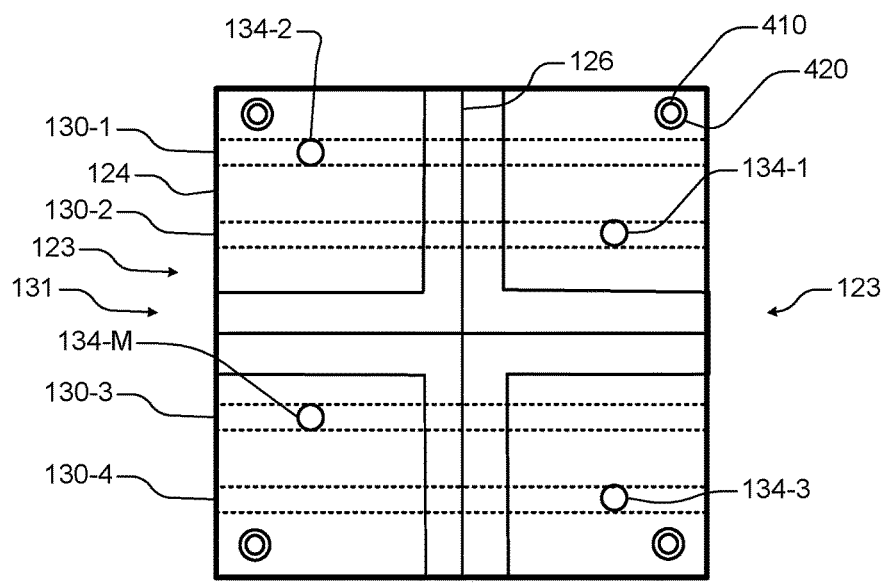
FIG. 7
FIG. 8
FIG. 9

INFRASTRUCTURE FLOOR TILES FOR SERVER RACK PLACEMENT

FIELD

The present disclosure relates to datacenters, and more particularly to infrastructure or tiles for server rack placement.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Datacenters provide bulk data storage and computing resources such as physical machines, virtual machines, and containers. Data service providers rent the data storage and computing resources to tenants. As demand increases, packing of the data storage and computing resources also increases. For example, a server room in the datacenter may include a large number of rows of server racks.

As demand increases, the operator of the datacenter deploys additional server racks to meet the demand. While the datacenter can be built out to the highest anticipated demand, this is costly since utilization will suffer until the utilization of the server racks in the datacenter increases.

SUMMARY

An infrastructure floor tile for supporting and positioning a server rack in a datacenter includes a body including a top surface, a bottom surface and side surfaces and a first alignment surface on the top surface. The first alignment surface includes at least one of a projection and a recess. When a server rack is positioned on the first alignment surface of the infrastructure floor tile, the server rack is aligned by the first alignment surface relative to the body. N horizontal channels extend from one of the side surfaces to an opposite one of the side surfaces, where N is an integer greater than one. N vertical channels extending from the top surface of the body to the N horizontal channels, respectively. At least one of power, cooling fluid and data lines are connected to the server rack through at least one of the N horizontal channels and at least one of the N vertical channels.

In other surfaces, the infrastructure floor tile is anchored to a floor of a datacenter using at least one of adhesive, concrete and a fastener. A vertical bore in the infrastructure floor tile is configured to receive a threaded bolt to anchor the infrastructure floor tile to the floor of the datacenter. A cylinder press fit into at least one of the N horizontal channels.

In other surfaces, a quarter-turn connector includes a first component arranged in one of the N vertical channels. The first component is configured to receive a second component connected to the server rack. A valve is opened and closed by relative rotation between the first component and the second component of the quarter-turn connector.

In other surfaces, the body is made of one or more materials selected from a group consisting of steel, aluminum and concrete. A slot is configured to receive a portion of a locking member. The alignment surface has at least one of a beveled surface and a "V"-shaped cross-section. The first alignment surface extends in first and second orthogonal directions. The first alignment surface has an "X" shape.

A server rack alignment system includes a server rack including a rack including a switch and a plurality of servers. The rack includes a bottom surface connected to a first alignment surface that is arranged in a downwardly-facing direction. The first alignment surface includes at least one of a projection and a recess. An infrastructure floor tile includes a body with a top surface, a bottom surface and side surfaces and a second alignment surface on the top surface. The second alignment surface includes at least one of a projection and a recess and wherein the second alignment surface is complimentary to the first alignment surface.

In other surfaces, when a server rack is positioned on the infrastructure floor tile, the first alignment surface of the server rack is aligned by the second alignment surface of the infrastructure floor tile relative to the body of the infrastructure floor tile. N horizontal channels extend from one of the side surfaces to an opposite one of the side surfaces, where N is an integer greater than one.

In other surfaces, N vertical channels extend from the top surface of the body to the N horizontal channels, respectively. At least one of power, cooling fluid and data lines are connected to the server rack through at least one of the N horizontal channels and at least one of the N vertical channels.

In other surfaces, a quick disconnector connects power to the infrastructure floor tile. The quick disconnector includes at least one of a plug and a socket. A quarter-turn connector and a valve connect fluid from the infrastructure floor tile to the server rack. A plurality of infrastructure floor tiles connects to the infrastructure floor tile.

A method for adding and removing capacity from a datacenter includes providing one or more rows of infrastructure floor tiles. Each of the infrastructure floor tiles includes a body with a top surface, a bottom surface and side surfaces and a first alignment surface on the top surface. The first alignment surface includes at least one of a projection and a recess. The method includes providing pre-configured server racks each including a rack, a switch and a plurality of servers. The rack includes a bottom surface connected to a second alignment surface arranged in a downwardly-facing direction. The second alignment surface includes at least one of a projection and a recess. The second alignment surface is complimentary to the first alignment surface. The method includes delivering one of the pre-configured server racks onto one of the infrastructure floor tiles to increase the capacity of the datacenter. The first and second alignment surfaces align the pre-configured server rack relative to the body of the one of the infrastructure floor tiles.

In other surfaces, the method includes delivering the one of the pre-configured server racks onto the one of the infrastructure floor tiles using an autonomous robot.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIG. 7 is a perspective view of an example of a quarter-turn connector for cooling fluid according to the present disclosure;

FIG. 8 is a side view of another power quick disconnect according to the present disclosure;

FIG. 9 is a plan view of an example of the infrastructure floor tile that is anchored to the floor using threaded bolts according to the present disclosure;

In the drawings, reference numbers may be reused to identify similar and/or identical elements.

DETAILED DESCRIPTION

The present disclosure is related to systems and methods for quickly deploying server racks to meet demand for additional capacity in datacenters. By utilizing pre-fabricated infrastructure floor tiles which can be located during construction, pre-configured server racks can be placed and connected accurately more quickly. As a result, the capacity of the datacenter can be optimized to achieve a desired utilization. The infrastructure floor tiles enable increased automation solutions and reduce build time. In some examples, the server racks are pre-built and delivered using an autonomous robot. Alignment surfaces on the infrastructure floor tiles are matched with alignment surfaces on the server rack to improve positioning of the server racks.

The infrastructure floor tiles are treated as large, immovable connectors that are pre-populated in the factory. In some examples, the infrastructure floor tiles are keyed to allow only one direction of connection. Infrastructure sources can be routed through the infrastructure floor tiles, including but not limited to, power, network, forced air, or liquid cooling. The infrastructure tiles can be located above grade or placed at grade when with floors are poured and leveled. The infrastructure tiles eliminate a leakage point at the bottom of the racks by filling the gap underneath the server rack.

Figure 1:
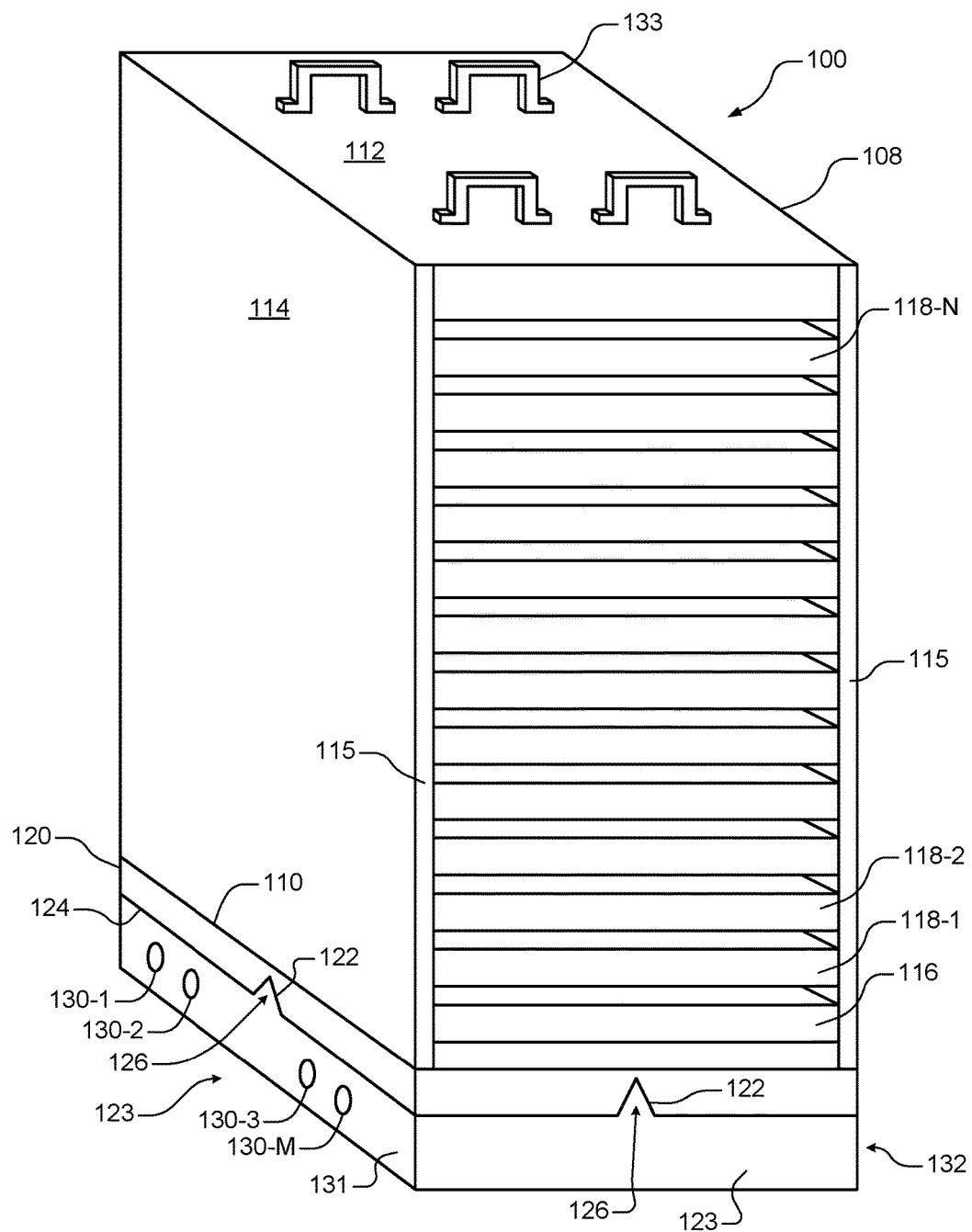
FIGS. 1 and 2 are perspective views of examples of a server rack alignment system including a server rack and infrastructure floor tiles according to the present disclosure.
Figure 2:
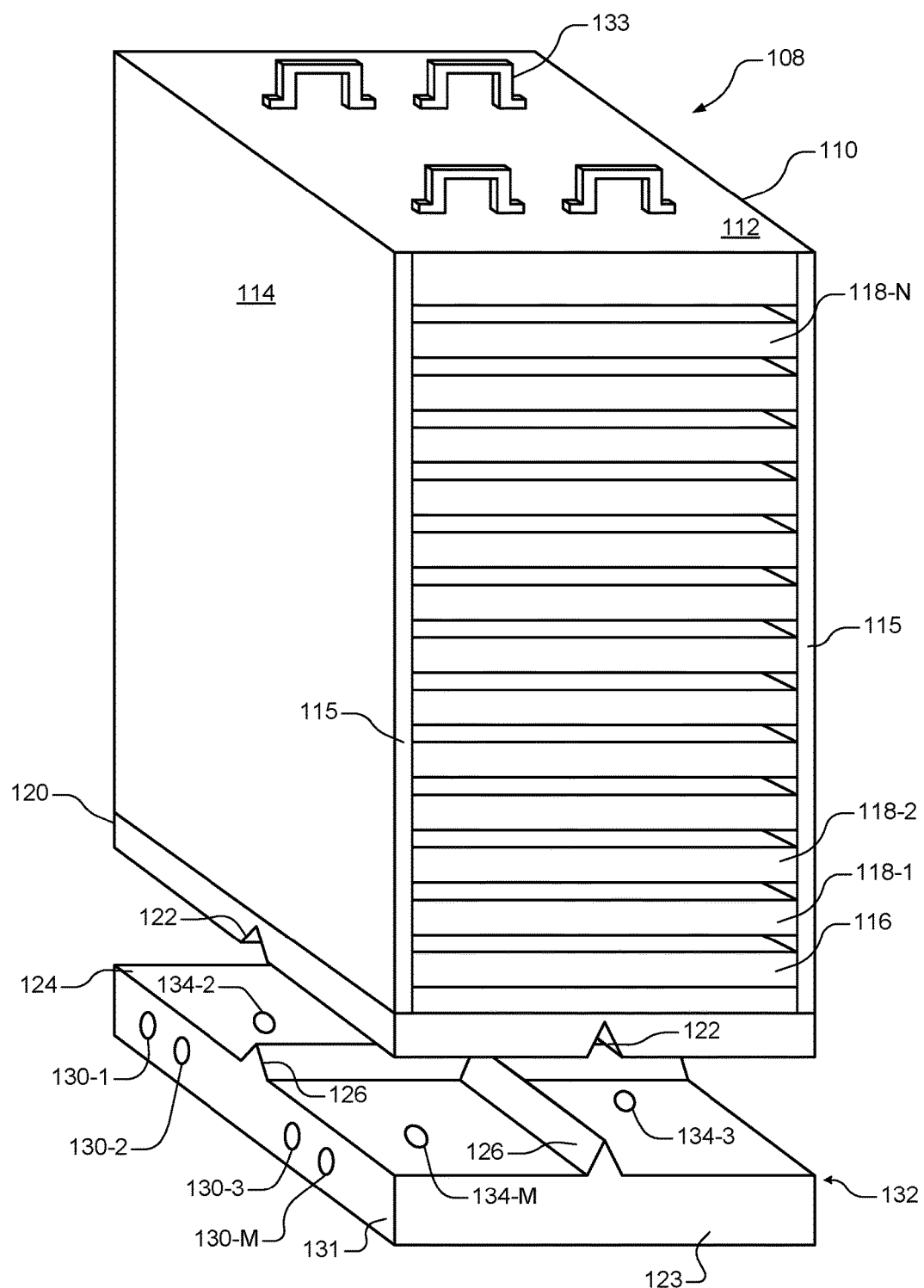

Referring now to FIGS. 1 and 2, a server rack is shown mounted on an infrastructure floor tile. In FIG. 1, a server rack alignment system 100 includes a server rack 108 having a bottom surface 110, a top surface 112, side surfaces 114 and slots 115 on opposing inner walls of side surfaces 114 to receive and position the switches and servers. The server rack 108 houses a switch 116 and/or servers 118-1, 118-2, . . . , and 118-N, (collectively servers 118) where N is an integer greater than or equal to one. In some examples, power, data, and/or cooling connections are made at a lower portion of the server rack 108. In some examples, the switch 116 is arranged at a bottom slot of the server rack 108 immediately adjacent to the bottom surface 110 and the servers 118 are arranged above the switch 116.

In some examples, quick disconnect style connectors are used for the cooling lines and power lines. Examples of power connectors include pin/socket, quick disconnect and surface-to-surface connectors. In some examples, cooling and power are supplied in parallel to adjacent infrastructure floor tiles. In other examples, cooling, data and power are supplied individually to each infrastructure floor tile.

A downwardly-facing alignment surface 120 is arranged adjacent to and below the bottom surface 110 of the server rack 108. The downwardly-facing alignment surface 120 includes one or more alignment surfaces 122 such as recesses, projections and/or a combination thereof. In the example shown in FIGS. 1 and 2, the alignment surfaces 122 include recesses.

An infrastructure floor tile 123 includes a body defining a top surface, a bottom surface and side surfaces. A top surface of the body defines an upwardly-facing alignment surface 124. The upwardly-facing alignment surface 124 includes one or more alignment surfaces 126 such as recesses, projections and/or a combination thereof. In the example shown in FIGS. 1 and 2, the alignment surfaces 126 include projections. In some examples, the alignment surfaces have "V"-shaped cross sections. In some examples, alignment surfaces with beveled or conical surfaces can be used. In some examples, the alignment surfaces extend in first and second orthogonal directions.

In some examples, the infrastructure floor tile 123 is made of steel, aluminum, concrete with pass-thru sleeves, and/or plastic. In other examples, a combination of materials is used. For example, the infrastructure floor tile may include a stamped steel top plate with connector attachment punch-outs and a concrete in-fill.

In some examples, the server rack is made of metal such as steel, aluminum and/or plastic. In some examples, the metal of the server rack may be coated with a protective layer made of plastic.

A plurality of horizontal channels 130-1, 130-2, . . . , and 130-M (collectively horizontal channels 130) extend between opposing side surfaces 131 and 132 of the infrastructure floor tile 123. In some examples, one or more hooks 133 may be arranged on the top surface 112 of the frame to allow the server rack 108 to be lifted. In some examples, an autonomous robot may be used to deliver the server rack 108 to a position on top of the infrastructure floor tile 123. The alignment surfaces 120 and 124 align the server rack 108 relative to the infrastructure floor tile 123.

In FIG. 2, vertical channels 134-1, 134-2, . . . , and 134-M (collectively vertical channels 134) connect to mid portions of the horizontal channels 130-1, 130-2, . . . , and 130-M, respectively to allow connection to components of the server rack 108. In some examples, power, ground, cooling fluid and/or data are supplied to the server racks via the horizontal channels 130 and/or the vertical channels 134. The cooling fluid can include liquids and/or gases. In some examples, adjacent server racks 108 are connected in parallel to the power, ground and cooling fluid. In some examples, data is supplied individually to each server rack. For example, individual optical fibers in an optical fiber bundle are connected to the server racks 108.

Figure 3:
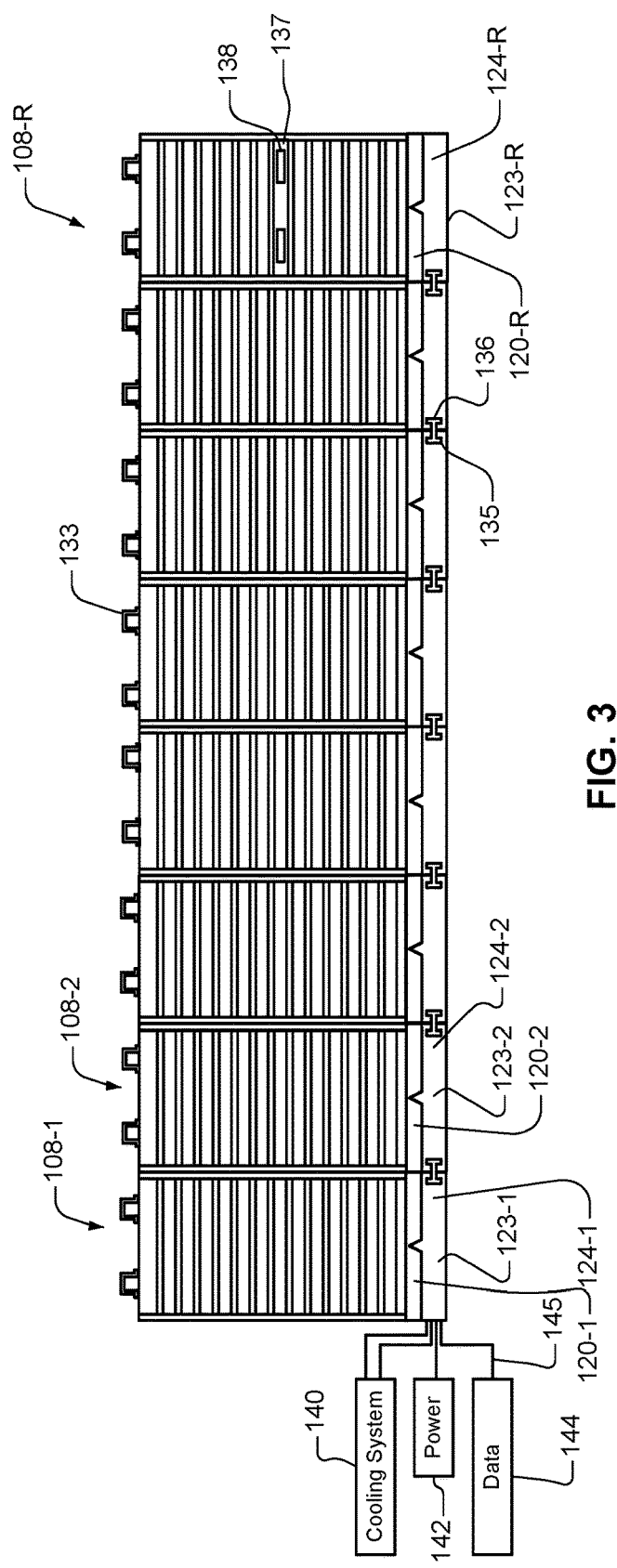
FIG. 3 is a side view illustrating an example of a plurality of server racks according to the present disclosure.

Referring now to FIG. 3, a plurality of server racks 108-1, 108-2, . . . , 108-R (collectively server racks 108) are mounted adjacent to each other on adjacent infrastructure floor tiles 123-1, 123-2, . . . , 123-R, respectively, (collectively infrastructure floor tiles 123), where R is an integer greater than one. In some examples, a locking member 135 may be arranged in a slot 136 formed in side or top surfaces of adjacent infrastructure floor tiles 123. In some examples, the locking member 135 may have a I-beam cross-section or another cross-section that provides a locking action. In use, the adjacent infrastructure floor tiles 123 are placed next to each other and the locking member is inserted into (or removed from) the slot 136 to lock (or unlock) the adjacent infrastructure floor tiles.

In some examples, the server racks 108 may include a cross member 137 including one or more pockets 138 for receiving a lift fork of the autonomous robot or other device. In some examples, the cross member 137 is arranged adjacent to the bottom surface 110, at a middle vertical portion of the server rack 108, and/or adjacent to the top surface 112.

A cooling system 140 includes a supply and return line that are connected to two of the horizontal channels 130. A power bus 144 is connected to conductors arranged in another one of the horizontal channels 130. In some examples, a plurality of optical fibers 145 are individually connected to the server racks 108 in another one of the horizontal channels 130. In some examples, the server racks 108 are anchored to the infrastructure floor tiles 123. For example, latches, straps, threaded studs and/or quarter-turn connectors may be used.

Figure 4:
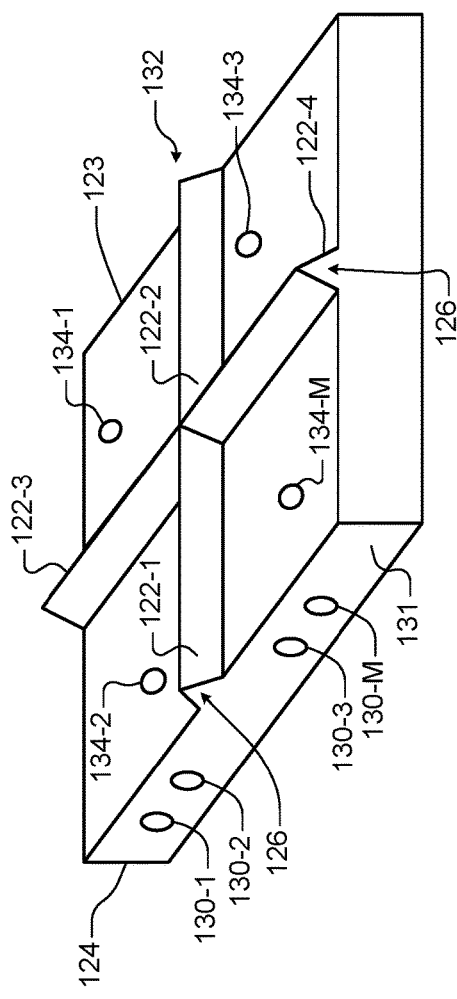
FIG. 4 is a perspective view of an example of an infrastructure floor tile according to the present disclosure.

Referring now to FIG. 4, the infrastructure floor tile 123 is shown in further detail. The horizontal channels 130 extend from one side 131 to the opposite side 132 of the infrastructure floor tile 123. The vertical channels 134-1, 134-2, . . . and 134-M intersect the horizontal channels 130-1, 130-2, . . ., and 130-M, respectively. In some examples, the horizontal channels 130-1 and 130-2 are associated with a coolant supply and return. The horizontal channel 130-3 is associated with power and/or ground. The horizontal channel 130-M is associated with data lines such as fiber-optic lines, although other types may be used.

In FIG. 4, the alignment surfaces 122 include first, second, third and fourth alignment surfaces 122-1, 122-2, 122-3 and 122-4. The alignment surfaces 122-1 and 122-2 are arranged along a first line and the alignment surfaces 122-3 and 122-4 are arranged along a second line that is perpendicular to the first line. While the alignment surfaces 122 define an "X"-shaped pattern, other patterns may be used.

Figure 5:
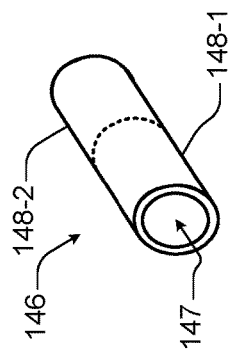
FIG. 5 is a perspective view of a cylinder that is press fit into adjacent horizontal channels of the infrastructure floor tiles for cooling fluid according to the present disclosure.

Referring now to FIG. 5, a cylinder 146 having an inner cavity 147 is press fit into a cooling channel between adjacent infrastructure floor tiles 123 to create a seal. For example, a first portion 148-1 of the cylinder 146 is press fit into a horizontal channel of one of the infrastructure floor tiles 123. A second portion 148-2 of the cylinder is press fit into a horizontal channel of another one of the infrastructure floor tiles 123.

Figure 6A:
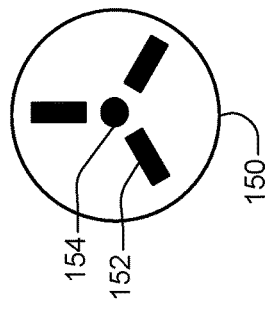
FIGS. 6A and 6B illustrate an example of plug and a socket, respectively, to provide a quick disconnection for power according to the present disclosure.
Figure 6B:
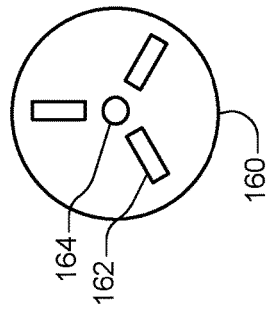

Referring now to FIGS. 6A and 6B, quick release connectors such as a plug 150 and a socket 160 may be used. In FIG. 6A, the plug 150 includes one or more projecting pins 152. In some examples, three projecting pins 152 are arranged at 120° intervals. In some examples, a projecting pin 154 may be used to provide a ground connection. In FIG. 6B, the socket 160 includes one or more sockets 162 for receiving the projecting pins 152, 154. In some examples, a socket 164 may be provided to accept the center projection 154 associated with the ground connection. In some examples, 1-4 sockets are provided to receive 1-4 pins. In some examples, 2 sockets are provided to receive 2 pins for a DC bus or single phase AC bus.

Figure 6C:
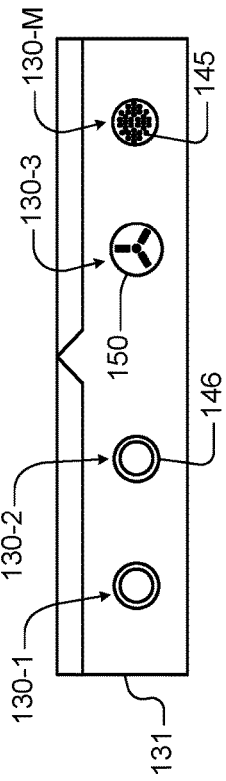
FIGS. 6C and 6D illustrate an example of the infrastructure floor tile with plug and socket connectors, press fit cooling fittings and fiber optic cable.
Figure 6D:
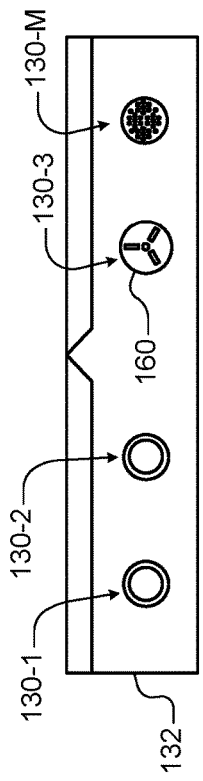

Referring now to FIGS. 6C and 6D, an example of opposing surfaces of the infrastructure floor tile are shown. The infrastructure floor tile 123 connects power to an adjacent infrastructure floor tile using plug and socket connectors such as the plug and socket 150, 160. Cooling fluid is supplied using the press fit cylinders 146. Data is connected using the optical fiber 145. While a specific configuration is shown, other configurations can be used.

Referring now to FIG. 7, a quarter-turn connector 200 for providing a connection to a cooling channel is shown. The quarter-turn connector 200 includes a male component 202 including a first portion 220 and a second portion 222. The second portion includes one or more pins 226 extending radially outwardly therefrom. In some examples, the first and second portions 220, 222 have a circular cross-section and the second portion 222 has a smaller diameter than the first portion 220. The first and second portions 220, 222 include a flow channel 227.

The quarter-turn connector 200 further includes a female component 229 including a cylindrical portion 234 defining an angled channel for receiving the pins 226. As the male component 202 slides into the cylindrical portion 234 of the female component 229, rotation in a first direction occurs. In some examples, the second portion 222 rotates in the first direction relative to the first portion 222 to cause a valve 250 to open. The valve 250 may be associated with the infrastructure floor tile or the server rack. As the male component 202 is removed from the cylindrical portion 234 of the female component 229, rotation in a second or opposite direction occurs. The second portion 222 rotates in the second direction relative to the first portion 220 to cause the valve 250 to close. In other examples, the rotational position of the pins 226 remains fixed and the cylindrical portion 230 rotates to cause the valve 250 to open and close.

Referring now to FIG. 8, a power connection system 300 is shown. The power connection system 300 includes a male connector 310 including beveled surface 312 and a planar contacting surface 314. A female connector 320 includes a complimentary beveled surface 322 including a planar contact surface 324. The female connector 320 may be received in a cavity 330. A plurality of springs 332 may be used to bias the female connector 320 against the male connector 310.

In some examples, the planar contacting surfaces 314 and 324 provide a single contact area for a single conductor. In other examples, the planar contacting surfaces 314 and 324 provide more than one contact area (separated by insulating material) to provide connections to more than one conductor. The male connector 310 is connected to one or more conductors 350. The one or more conductors 350 are connected to the plug 150 and the socket 160.

Referring now to FIG. 9, the infrastructure floor tile 123 is shown in further detail. The horizontal channels 130 extend from one side 131 to the opposite side 132 of the infrastructure floor tile 123. In some examples, the infrastructure floor tiles 123 are anchored to the floor. In some examples, countersunk bores 410 may be provided at one or more locations on the infrastructure floor tile 123. A fastener 420 such as a threaded bolt is inserted through the countersunk bores 410 to allow the infrastructure floor tile 123 to be rigidly attached to an underlying surface. As can be appreciated, there are other ways to anchor the infrastructure floor tiles 123 to the floor. For example, adhesive (not shown) may be used to glue the infrastructure floor tiles to the underlying floor. Alternately, concrete (not shown) may be poured around the infrastructure floor tiles 123. In other examples, concrete anchor bolts (not shown) may be used.

Figure 10:
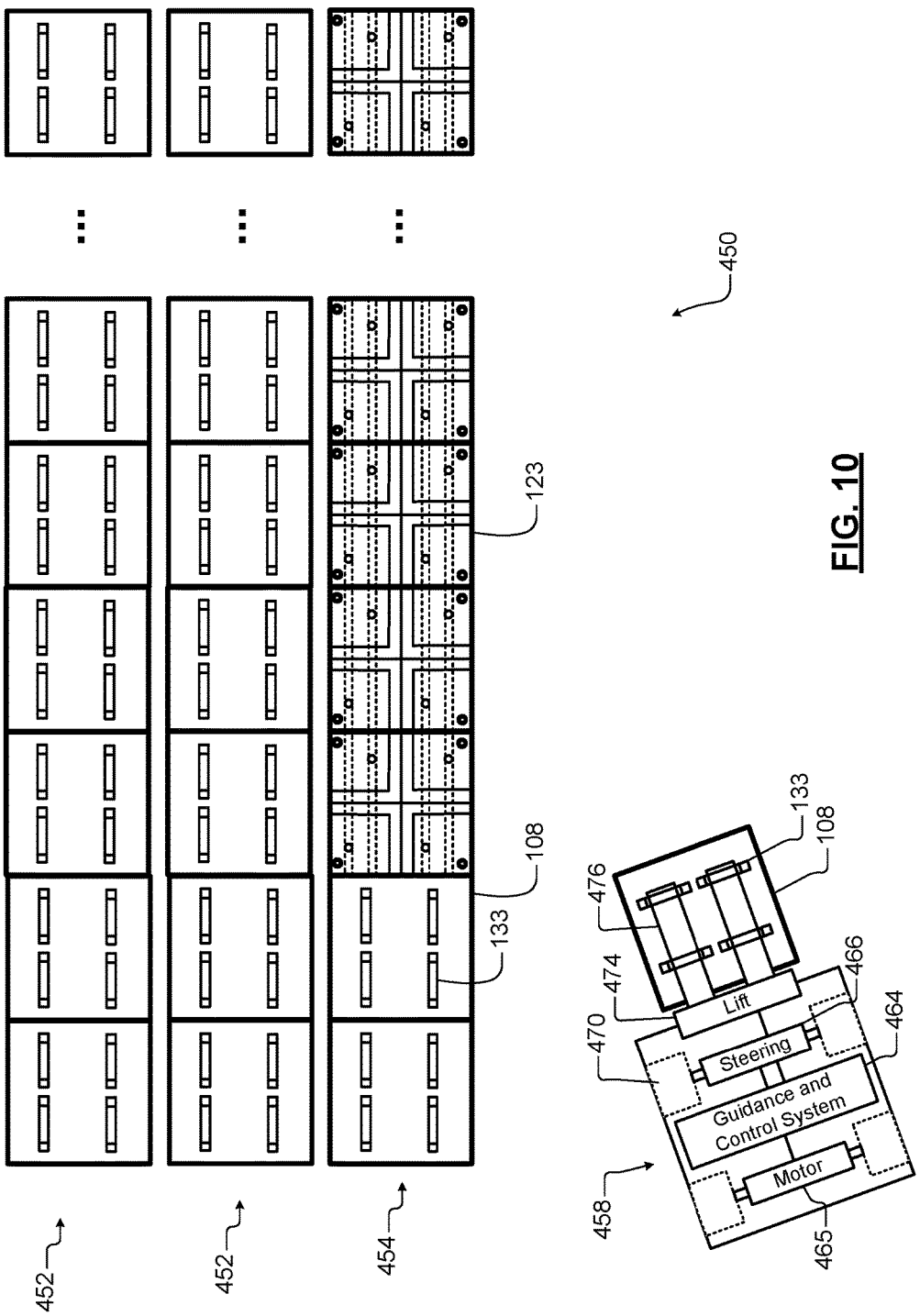
FIG. 10 is a functional block diagram illustrating delivery of server racks onto the infrastructure floor tile using an autonomous robot.

Referring now to FIG. 10, a server rack delivery system 450 shown. In FIG. 10, one or more rows of server racks 108 have already been delivered and aligned by the infrastructure floor tile (as shown at 452). A partially completed row is shown at 454. An autonomous robot 458 is shown to include a guidance and control system 464, a motor 465, a steering system 466 and a lift system 474. The guidance and control system 464 includes a positioning system such as a global positioning system (GPS) system to guide the autonomous robot 458 into a correct position to deliver or remove the server rack 108 on the corresponding infrastructure floor tile 123. A battery pack (not shown) may be provided if the motor is an electric motor. A fuel tank (not shown) may be provided if the motor is a combustion motor. In some examples, the lift system 474 includes an electric motor or hydraulic cylinder (not shown) and one or more forks 476 that engage hooks 133 arranged on the top surface of the server rack 108 (or at another location). The autonomous robot 458 delivers or removes the server racks 108 as needed.

Figure 11:
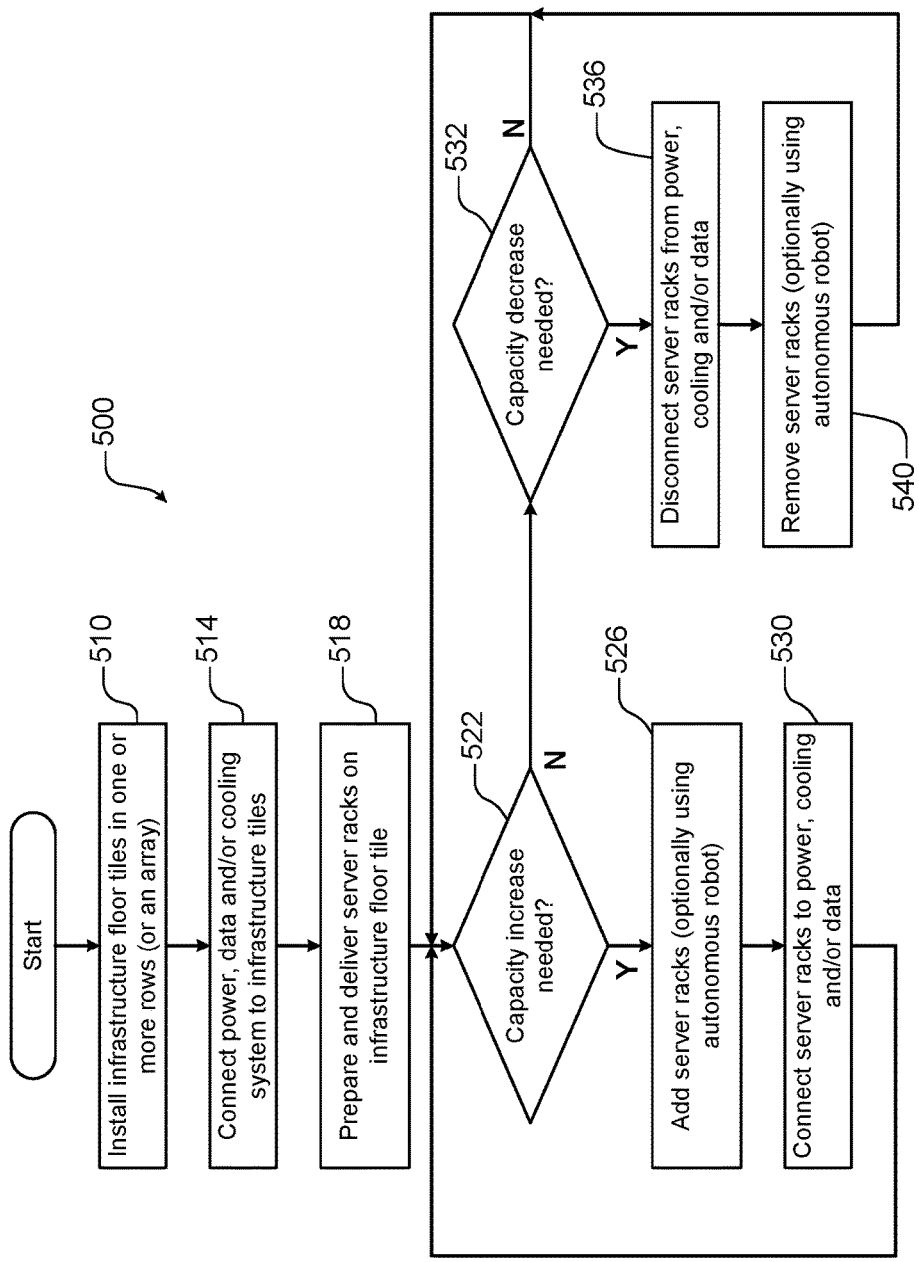
FIG. 11 is a flowchart of an example of a method for adding and removing capacity in the dater center according to the present disclosure.

Referring now to FIG. 11, a method 500 for automatically increasing and decreasing capacity of the datacenter using an autonomous robot is shown. At 510, infrastructure floor tiles are arranged on a floor of the datacenter in a first row at a desired location. One or more additional rows of the infrastructure floor tiles may be arranged adjacent to the first row. At 514, power, data and/or cooling system lines are connected to the infrastructure floor tiles. At 518, server racks are arranged on the infrastructure floor tiles. In some examples, an autonomous robot is used to position the server racks on the infrastructure floor tiles. A sufficient number of server racks are installed for the current or near future demand.

At 522, the method determines whether the capacity of datacenter needs to be increased. If 522 is true, additional server racks are installed on the infrastructure floor tiles. In some examples, the autonomous robot is used to position the server racks. At 530, the server racks are connected to power, cooling and/or data. If 522 is false, the method determines whether there's a capacity decrease that is needed. If 532 is true, the server racks are disconnected from power, cooling and/or data at 536. At 540, the server racks are removed. In some examples the server racks are removed using an autonomous robot.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain surfaces, any one or more of those surfaces described with respect to any embodiment of the disclosure can be implemented in and/or combined with surfaces of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

The invention claimed is:

1. An infrastructure floor tile for supporting and positioning a server rack in a datacenter, comprising:
    a body including a top surface, a bottom surface, and side surfaces;
    a first alignment surface on the top surface, wherein the first alignment surface includes at least one of a projection or a recess having multiple portions at least some of which are non-parallel to one another, and wherein when a server rack is positioned on the first alignment surface of the infrastructure floor tile, multiple portions of a recess or projection on a second alignment surface of the server rack are mated to corresponding multiple portions of the projection or recess on the first alignment surface of the infrastructure floor tile, thereby aligning the server rack relative to the body of the infrastructure floor tile in two dimensions;
    N horizontal channels extending from one of the side surfaces to an opposite one of the side surfaces, where N is an integer greater than one; and
    N vertical channels extending from the top surface of the body to the N horizontal channels, respectively, wherein the N vertical channels individually correspond and coupled to one of the N horizontal channels, and wherein at least one of power, cooling fluid and data lines are connected to the server rack through at least one of the N horizontal channels and at least one of the corresponding N vertical channels.

2. The infrastructure floor tile of claim 1, wherein the infrastructure floor tile is anchored to a floor of a datacenter using at least one of adhesive, concrete and a fastener.

3. The infrastructure floor tile of claim 2, further comprising a vertical bore in the infrastructure floor tile configured to receive a threaded bolt to anchor the infrastructure floor tile to the floor of the datacenter.

4. The infrastructure floor tile of claim 1, further comprising a cylinder press fit into at least one of the N horizontal channels.

5. The infrastructure floor tile of claim 1, further comprising:
    a quarter-turn connector including a first component arranged in one of the N vertical channels, wherein the first component is configured to receive a second component connected to the server rack; and a valve that is opened and closed by relative rotation between the first component and the second component of the quarter-turn connector.

6. The infrastructure floor tile of claim 1, wherein the body is made of one or more materials selected from a group consisting of steel, aluminum and concrete.

7. The infrastructure floor tile of claim 1, further comprising a slot configured to receive a portion of a locking member.

8. The infrastructure floor tile of claim 1, wherein the alignment surface has at least one of a beveled surface and a "V"-shaped cross-section.

9. The infrastructure floor tile of claim 1, wherein the first alignment surface extends in first and second orthogonal directions.

10. The infrastructure floor tile of claim 1, wherein the multiple portions of the at least one of the projection or recess on the first alignment surface include a first portion generally perpendicularly intercepting a second portion.

11. A server rack alignment system, comprising:
    a server rack including a rack including a switch and a plurality of servers, wherein the rack includes a bottom surface connected to a first alignment surface that is arranged in a downwardly-facing direction, wherein the first alignment surface includes at least one of a projection or a recess having multiple portions at least some of which are non-parallel to one another; and
    an infrastructure floor tile including a body with a top surface, a bottom surface, and side surfaces between the top and bottom surfaces and a second alignment surface on the top surface, wherein the second alignment surface includes at least one of a recess or projection having multiple portions, and wherein the second alignment surface is complimentary to the first alignment surface such that when the server rack is positioned on the infrastructure floor tile, the multiple portions of the projection or recess on the first alignment surface are mated to corresponding portions of the recess or projection on the second alignment surface of the infrastructure floor tile, thereby aligning the server rack relative to the body of the infrastructure floor tile in two dimensions.

12. The server rack alignment system of claim 11, wherein when a server rack is positioned on the infrastructure floor tile, the first alignment surface of the server rack is aligned by the second alignment surface of the infrastructure floor tile relative to the body of the infrastructure floor tile.

13. The server rack alignment system of claim 11, further comprising N horizontal channels extending from one of the side surfaces to an opposite one of the side surfaces, where N is an integer greater than one.

14. The server rack alignment system of claim 13, further comprising N vertical channels extending from the top surface of the body to the N horizontal channels, respectively, wherein at least one of power, cooling fluid and data lines are connected to the server rack through at least one of the N horizontal channels and at least one of the N vertical channels.

15. The server rack alignment system of claim 13, further comprising a quick disconnector connecting power to the infrastructure floor tile.

16. The server rack alignment system of claim 15, wherein the quick disconnector includes at least one of a plug and a socket.

17. The server rack alignment system of claim 13, further comprising a quarter-turn connector and a valve to connect fluid from the infrastructure floor tile to the server rack.

18. The server rack alignment system of claim 11, further comprising:
    a plurality of infrastructure floor tiles connected to the infrastructure floor tile.

19. A server rack alignment system, comprising:
    a server rack including a rack including multiple slots configured to individually receive a server, wherein the server rack includes a first alignment surface having a recess with a first recess portion and a second recess portion intersecting the first recess portion generally perpendicularly; and
    an infrastructure floor tile including a body with a second alignment surface having a projection with a first projection portion and a second projection portion intersecting the first projection portion generally perpendicularly, and wherein the second alignment surface is complimentary to the first alignment surface such that when the server rack is positioned on top of the infrastructure floor tile, the first and second projection portions of the projection on the second alignment surface of the infrastructure floor tile are mated to and received by corresponding first and second recess portions of the recess on the first alignment surface, thereby aligning the server rack relative to the body of the infrastructure floor tile in two dimensions.

20. The server rack alignment system of claim 19 wherein the infrastructure floor tile further includes:
    multiple first channels extending from a side surface to an opposite side surface of the body; and
    multiple second channels extending from the second alignment surface of the body to the multiple first channels, respectively, wherein the multiple first channels individually correspond and coupled to one of the second channels to allow power, a cooling fluid, or a data line be connected to the server rack through at least one of the multiple first channels and at least one of the corresponding multiple second channels.

* * * * *